United States Patent
Liu

(10) Patent No.: US 7,342,785 B2
(45) Date of Patent: Mar. 11, 2008

(54) COOLING DEVICE INCORPORATING BOILING CHAMBER

(75) Inventor: Tay-Jian Liu, Guangdong (CN)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 205 days.

(21) Appl. No.: 11/162,858

(22) Filed: Sep. 26, 2005

(65) Prior Publication Data

US 2006/0238979 A1 Oct. 26, 2006

(30) Foreign Application Priority Data

Apr. 22, 2005 (TW) .............................. 94113013 A

(51) Int. Cl.
*H05K 7/20* (2006.01)
(52) U.S. Cl. ...................... 361/695; 361/697; 361/698; 361/699; 361/700; 257/714; 257/715; 257/722; 174/15.1; 174/15.2; 174/16.1; 174/16.3; 165/80.3; 165/80.4
(58) Field of Classification Search ...................... None
See application file for complete search history.

(56) References Cited

U.S. PATENT DOCUMENTS

| 5,168,919 | A | * | 12/1992 | Berenholz et al. ......... 165/80.4 |
| 5,508,884 | A | * | 4/1996 | Brunet et al. ................ 361/698 |
| 5,630,469 | A | | 5/1997 | Butterbaugh |
| 5,647,430 | A | * | 7/1997 | Tajima .................. 165/104.33 |
| 6,382,306 | B1 | * | 5/2002 | Hsu ........................... 165/80.3 |
| 6,550,531 | B1 | * | 4/2003 | Searls et al. ........... 165/104.33 |
| 6,588,498 | B1 | * | 7/2003 | Reyzin et al. ......... 165/104.33 |
| 6,609,561 | B2 | * | 8/2003 | Sauciuc et al. ........ 165/104.33 |
| 6,650,544 | B1 | * | 11/2003 | Lai ............................. 361/700 |
| 6,714,413 | B1 | * | 3/2004 | Ghosh et al. ................ 361/700 |
| 6,808,015 | B2 | * | 10/2004 | Osakabe ................ 165/104.25 |
| 6,860,321 | B2 | * | 3/2005 | Ji-Hai et al. ................ 165/80.3 |
| 6,918,431 | B2 | * | 7/2005 | Reyzin et al. ......... 165/104.21 |
| 6,967,845 | B2 | * | 11/2005 | Chiang et al. .............. 361/709 |
| 7,186,590 | B2 | * | 3/2007 | Alcoe et al. ................ 438/122 |
| 2003/0205363 | A1 | | 11/2003 | Chu et al. | |

FOREIGN PATENT DOCUMENTS

| CN | 2528111 | 12/2002 |
| CN | 2588533 | 11/2003 |
| TW | 200418358 | 9/2004 |
| TW | M251193 | 11/2004 |

* cited by examiner

Primary Examiner—Boris Chérvinsky
(74) Attorney, Agent, or Firm—Winston Hsu

(57) ABSTRACT

A cooling device incorporating a boiling chamber includes a heat sink (10), a fan (30) and a fan duct (50) covering the heat sink and the fan therein. The heat sink includes a chamber (14) receiving liquid (26) therein and a mounting plate (16) located at a bottom surface (200) of the chamber. The fan duct is mounted to two opposite edges of the mounting plate. The fan is mounted in a front part while the heat sink is mounted in a rear part of the fan duct. A top wall (220) of the chamber has a plurality of fins (18) extending upwardly therefrom. The liquid has a level higher than that of a bottom surface of the top wall so that a constant contact between the liquid and the top wall is ensured.

19 Claims, 7 Drawing Sheets

US 7,342,785 B2

COOLING DEVICE INCORPORATING BOILING CHAMBER

FIELD OF THE INVENTION

The present invention relates to a cooling device, and particularly to a cooling device incorporating a boiling chamber.

DESCRIPTION OF RELATED ART

As electronic industry continues to advance, electronic components such as central processing units (CPUs), are made to provide faster operational speeds and greater functional capabilities. When a CPU operates at a high speed, its temperature frequently increases greatly. It is desirable to dissipate the heat generated by the CPU quickly. To solve this problem of heat generated by the CPU, a cooling device is often used to be mounted on the top of the CPU to dissipate heat generated thereby.

A conventional cooling device comprises a heat sink with a base for thermally contacting with the CPU to absorb heat therefrom and a fan mounted on the heat sink for generating forced airflow to the heat sink. For enhancing the heat dissipation capability of the heat sink, a heat spreader is arranged between the base of the heat sink and the CPU, which is made of a material having a heat conductivity higher than that of the heat sink, for enhancing the speed of heat transfer from the CPU to the heat sink. However, as the CPU operates faster and faster, and, therefore generates larger and larger amount of heat, the conventional heat sink, which transfers heat via heat conduction means, cannot meet the increased heat dissipating requirement of the CPU. It is well known that the heat transfer efficiency by phase change of liquid (i.e. from liquid to vapor) is better than other mechanisms, such as heat conduction or heat convection without phase change. It is also well known that heat absorbed by liquid having a phase change is hundred times more than that of the liquid without phase change. Accordingly, cooling devices with boiling chambers have been developed recently. A boiling chamber having a vacuumed space receiving a working liquid therein. The working liquid can easily evaporate into vapor when the working liquid absorb a small amount of heat thereby effectively dissipating heat from a heat-generating source, for example, a CPU.

However, the conventional boiling chamber cooling device has several disadvantages needing to be improved: 1. the forced airflow generated by the fan of the cooling device cannot be sufficiently utilized to dissipate heat absorbed by the cooling device from the heat-generating electronic component; 2. the parts consisting of the cooling device are not pre-assembled together in advance before being mounted to the heat-generating electronic component, which causes the mounting of the cooling device to the heat-generating electronic component to be laborious; furthermore, it is difficult to precisely assemble the parts separately on the heat-generating electronic component; when one of the parts is mounted with a large positional error, the performance of the whole cooling device is adversely affected.

For the foregoing reasons, therefore, there is a need in the art for a cooling device which overcomes the above-mentioned problems.

SUMMARY OF INVENTION

According to a preferred embodiment of the present invention, a cooling device incorporating a boiling chamber comprises a heat sink, a fan located at one side of the heat sink, a fan duct covering the heat sink and the fan therein, and several pins for securing the cooling device. The heat sink comprises a chamber receiving working liquid therein and a mounting plate located at a bottom surface of the chamber. The working liquid easily evaporates when it receives heat. Two opposite edges of the mounting plate extend beyond two opposite sides of the heat sink. Each edge defines two securing hole therein. The fan duct comprises a top plate and two opposite side plates extending downwardly from two opposite sides of the top plate. A mounting portion extends outwardly from each side plate. Each mounting portion defines two tubes corresponding to the two securing holes of the heat sink. The pins pass through the securing holes and locked in the tubes, respectively. The chamber has a top wall. A plurality of fins extends upwardly from the top wall. The working liquid is in constantly contact with a inner surface of the top wall, and has a level higher than that of the inner surface of the top wall.

Other objects, advantages and novel features of the present invention will be drawn from the following detailed description of a preferred embodiment of the present invention with attached drawings, in which:

DETAILED DESCRIPTION

Figure 1:
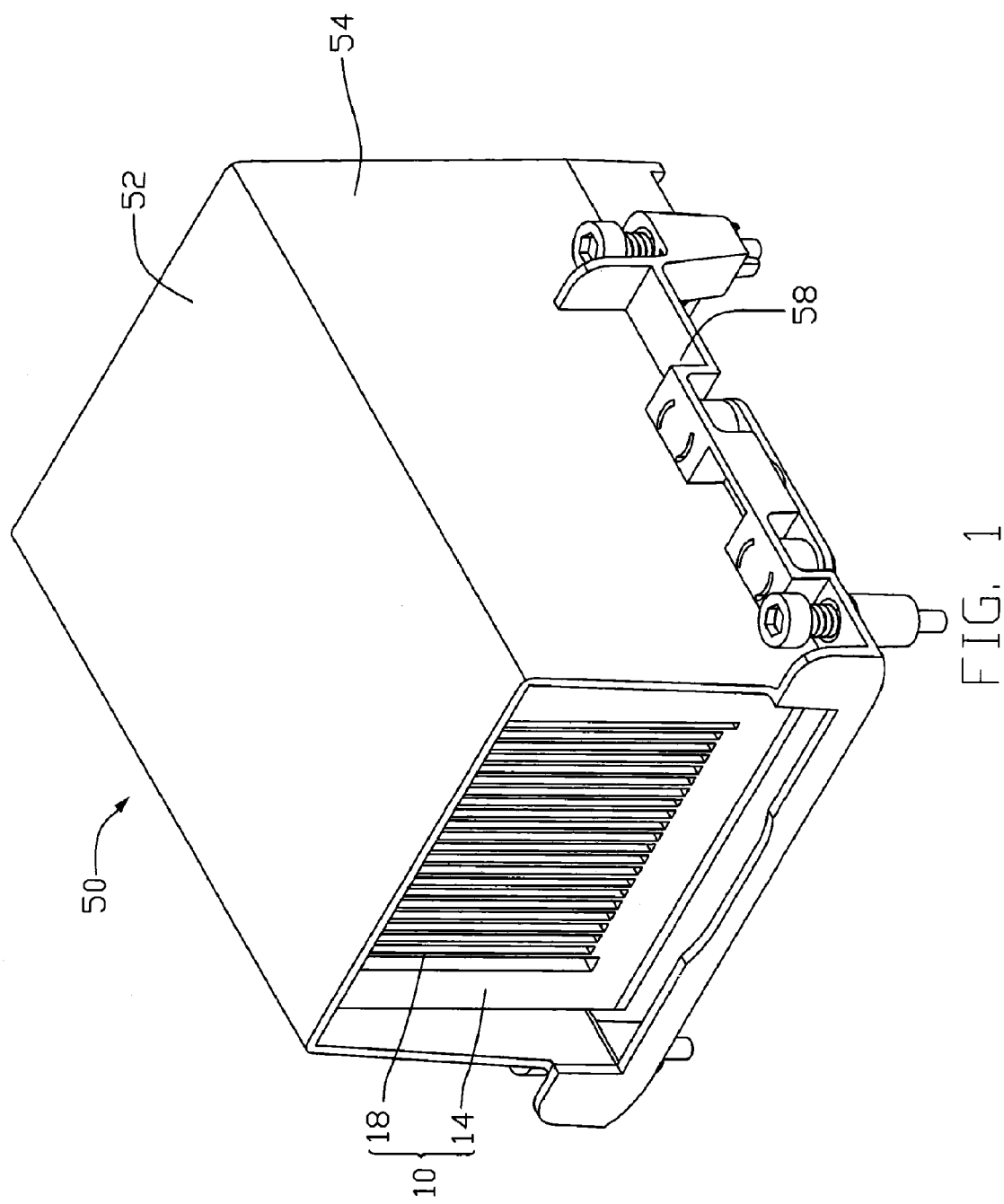
FIG. 1 is an assembled, isometric view of a cooling device with a boiling chamber in accordance with a preferred embodiment of the present invention.
Figure 2:
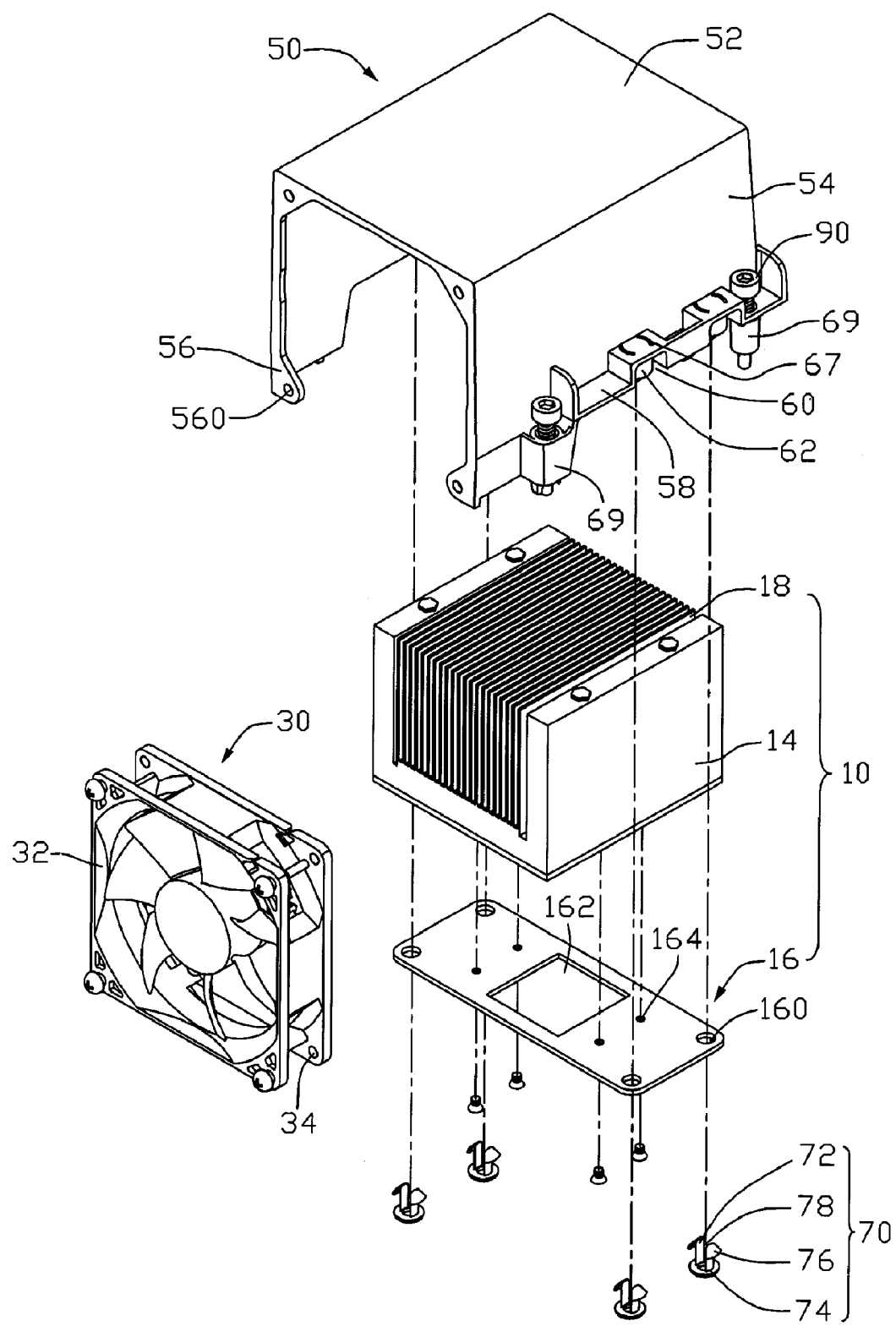
FIG. 2 is an exploded view of the cooling device of FIG. 1.

FIGS. 1-2 show a cooling device incorporating a boiling chamber in accordance with a preferred embodiment of the present invention. The cooling device comprises a heat sink 10, a fan 30 for generating an airflow to the heat sink 10, a fan duct 50 covering the heat sink 10 and fan 30 therein and a plurality of pins 70 for securing the cooling device.

Figure 3:
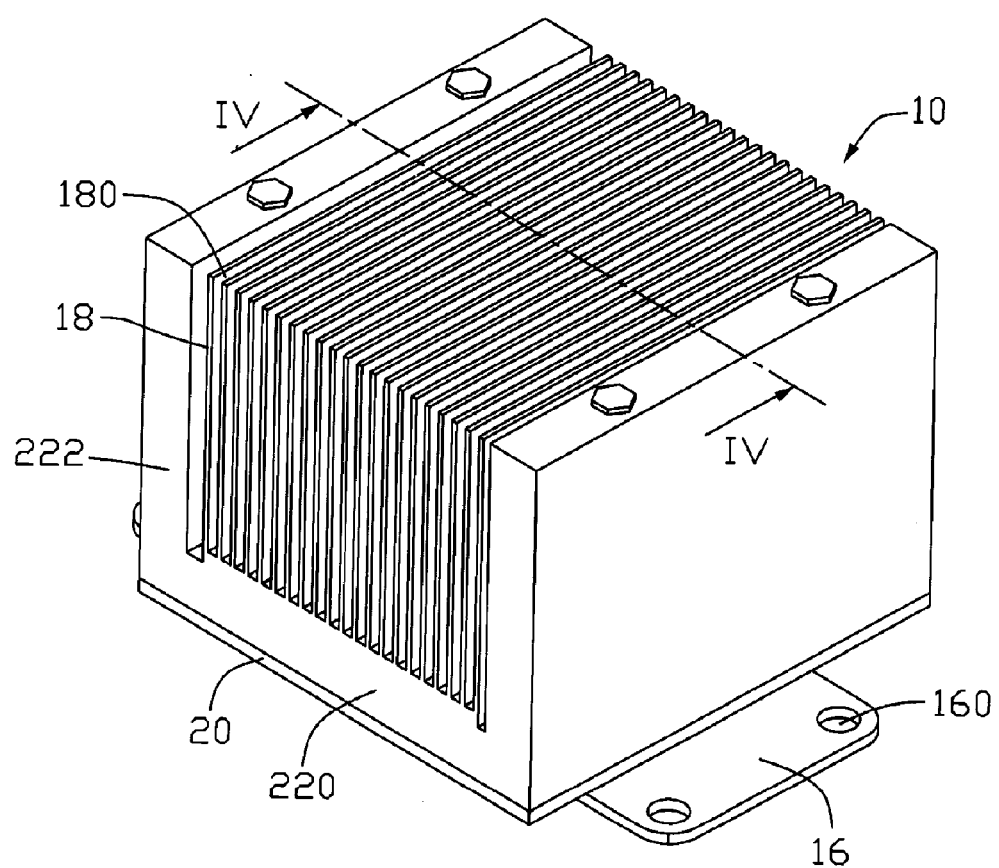
FIG. 3 is an assembled, isometric view of a heat sink of the cooling device of FIG. 2.
Figure 4:
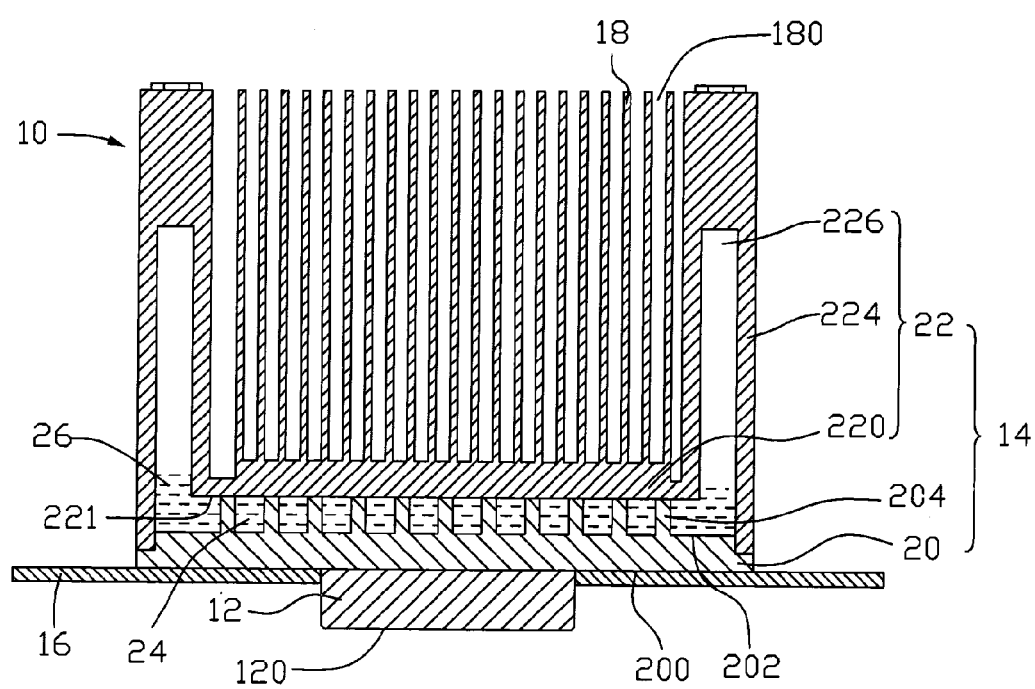
FIG. 4 is a cross-sectional view of the heat sink of FIG. 3, taken along line IV-IV thereof.

Referring also to FIGS. 3-4, the heat sink 10 comprises a heat spreader 12 has a bottom surface 120 for thermally contacting with a CPU (not shown), a boiling chamber 14 mounted on the heat spreader 12, a mounting plate 16 connected to a bottom surface of the boiling chamber 14 and surrounding the heat spreader 12, and a plurality of fins 18 arranged on a top of the boiling chamber 14. An air passage 180 is defined between two neighboring fins 18.

The boiling chamber 14 comprises a bottom wall 20 and a cover 22 hermetically connected to the bottom wall 20 to thereby form a sealed space 24 for containing working liquid (boiling mixture) 26 therein. The working liquid 26 evaporates into vapor when the working liquid 26 absorbs a small amount of heat from the heat spreader 12 and the bottom wall 20. The cover 22 comprises a top wall 220 parallel to the bottom wall 20 and a tower 222 formed on each of two lateral sides of the heat sink 10. The top wall 220 is sandwiched between the towers 222. The tower 222 has an inverted U-shaped cross section and comprises a pair of spaced side walls 224, one of which integrally extends from the top wall 220 and the other of which is hermetically attached to the bottom wall 20. A buffering region 226 is formed between the side walls 224. The buffering region 226 communicates with the space 24 formed between the top wall 220 and the bottom wall 20. The buffering region 226 is higher than the sealed space 24.

The bottom wall 20 comprises a bottom surface 200 for contacting with and absorbing heat from the heat spreader 12, and a top surface 202 opposing the bottom surface 200. A plurality of heat transfer enhancing structures 204 is arranged between the top surface 202 of the bottom wall 20 and a bottom surface 221 of the top wall 220. Thus the heat transfer enhancing structures 204 are capable of transferring heat from the bottom wall 20 to the top wall 220 by the boiling liquid 26 to thereby overcome the heat transfer threshold by the liquid 26 if the liquid 26 is not able to timely contact with the top wall 220 during the initial phase of heat transfer from the bottom wall 20 to the top wall 220. Furthermore, the buffering region 226 can absorb agitation wave generated by the boiling liquid 26 to thereby avoid instability of contact between the liquid 26 surface and the bottom surface 221 of the top wall 220. Therefore, when the liquid 26 is boiling, the liquid 26 can continuously and stably contact with and transfer heat to the bottom surface 221 of the top wall 220 of the boiling chamber 14, thereby improving heat dissipation efficiency of the cooling device The mounting plate 16 is connected to the bottom surface 200 of the bottom wall 20 of the boiling chamber 14. Two opposite edges of the mounting plate 16 extend beyond two opposite sides of the heat sink 10 to define two securing holes 160 in each of the two opposite edges for securing the mounting plate 16 with the fan duct 50. An opening 162 is defined in a central portion of the mounting plate 16 corresponding to the heat spreader 12. A plurality of fixing holes 164 is defined in the mounting plate 16 around the opening 162 for fixing the mounting plate 16 with the boiling chamber 14. A plurality of screws (not labeled) is used to extend through the fixing holes 164 and threadedly engage in the bottom wall 20 to thereby fasten the mounting plate 16 and the boiling chamber 14 together. Although in the shown preferred embodiment, the mounting plate 16 is separate from the bottom wall 20 of the boiling chamber 14; it can be realized by those skilled in the art that the mounting plate 16 can be integrally formed with the bottom wall 20 of the boiling chamber 14.

The top wall 220 is integrally formed with the tower 222 via forging or die-casting to form the cover 22, which can simplify the process of manufacturing. Also the bottom wall 20 is integrally formed with the heat transfer enhancing structures 204 for the same reason. It can be also realized by those skilled in the art that the bottom wall 20 can be integrally formed with the cover 22, whereby the boiling chamber 14 is integrally formed. This can eliminate heat resistance generated by an interface between the bottom wall 20 and the cover 22.

Particularly referring to FIG. 2, the fan 30 is to be located at a front side of the heat sink 10 facing the air passages 180 of the heat sink 10, whereby an airflow generated by the fan 30 can directly flow through the air passages 180. The fan 30 comprises a square shaped frame 32 defining an aperture 34 in each of four corners thereof.

Figure 5:
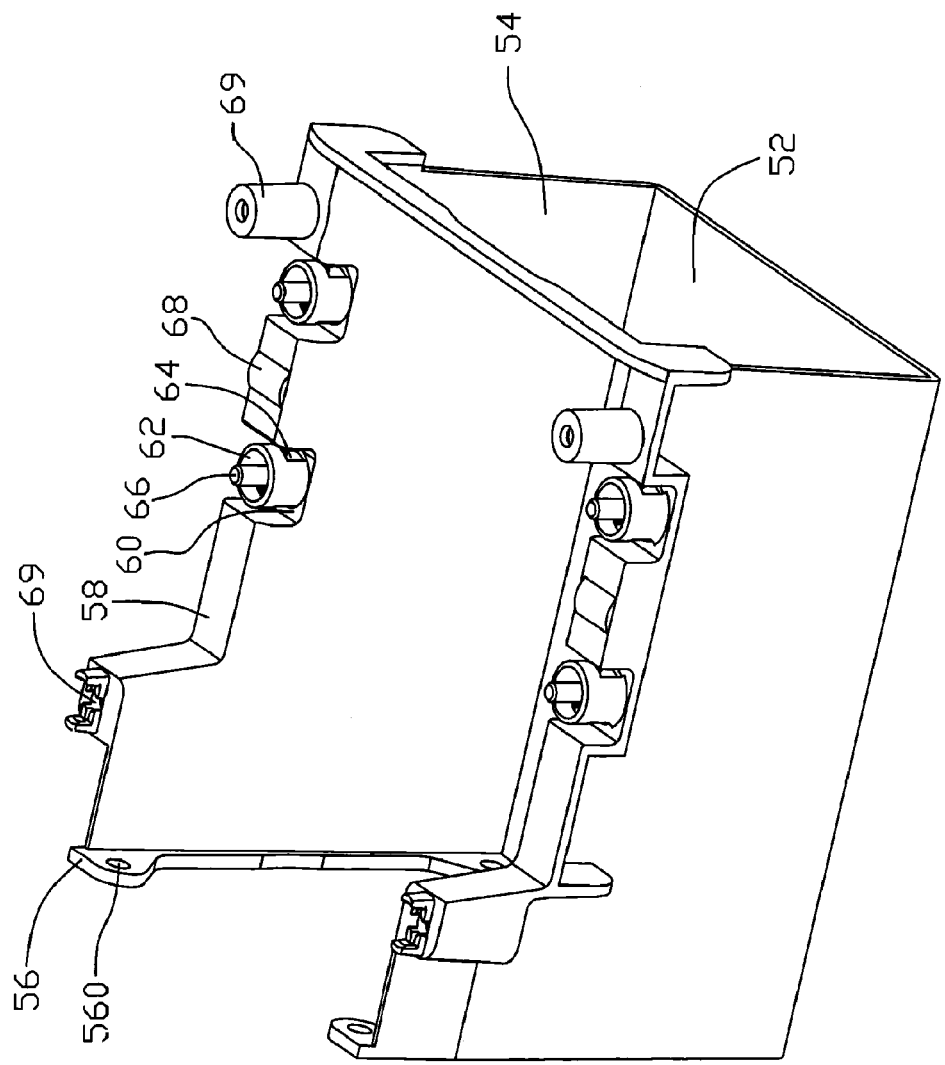
FIG. 5 is an isometric view of a fan duct of the cooling device of FIG. 2, viewed from another aspect.

Also referring to FIG. 5, the fan duct 50 comprises a top plate 52 and a pair of side plates 54 extending downwardly from two opposite sides of the top plate 52 respectively. Each of bottom ends of the side plates 54 of the fan duct 50 forms a stepped configuration. A flange 56 extends inwardly from a front edge of the fan duct 50 near the fan 30. Four bores 560 are defined in the flange 56 corresponding to the apertures 34 of the fan 30.

A mounting portion 58 extends outwardly from the bottom end of each of the side plates 54 of the fan duct 50. Each mounting portion 58 defines two grooves 60 in a bottom thereof, corresponding to the two securing holes 160 of the mounting plate 16. A tube 62 is formed in each groove 60 of the mounting portion 58. A pair of mounting holes 64 is defined in an outer wall of the tube 62. A pole 66 extends downwardly from a central portion of the tube 62 for locating the fan duct 50 in an assembly of the cooling device. A protrusion 68 extends downwardly from a bottom of each of the mounting portions 58. Each protrusion 68 is formed between the grooves 60 of each mounting portion 58. A bottom surface of the protrusion 68 is arc-shaped. The mounting portion 58 is integrally formed with the fan duct 50. A pair of arc-shaped slits 67 is defined in the mounting portion 58 above a corresponding groove 62. Each arc-shaped slit 67 communicates with a corresponding mounting hole 64. Two posts 69 extend downwardly from each of the two mounting portions 58, for securing the cooling device with a motherboard 200 and an enclosure 300 (FIG. 6) of a computer.

Particularly referring to FIG. 2, four pins 70 are adopted for securing the heat sink 10 with the fan duct 50. Each of the pins 70 is integrally formed by plastic injection. Each pin 70 comprises a main body 72 having a diameter approximately the same as or less than a bore diameter of the tube 62, a pair of hooks 76 extending oppositely, downwardly and aslant from a top end of the main body 72, and a retaining ring 74 extending outwardly from a bottom end of the main body 72. Thus an outer diameter of the hooks 76 or the retaining ring 74 is larger than the bore diameter of the tube 62. A slot 78 is defined in the main body 72 for enhancing the flexibility of the pin 70, particularly for enhancing the flexibility of the hooks 76.

Figure 6:
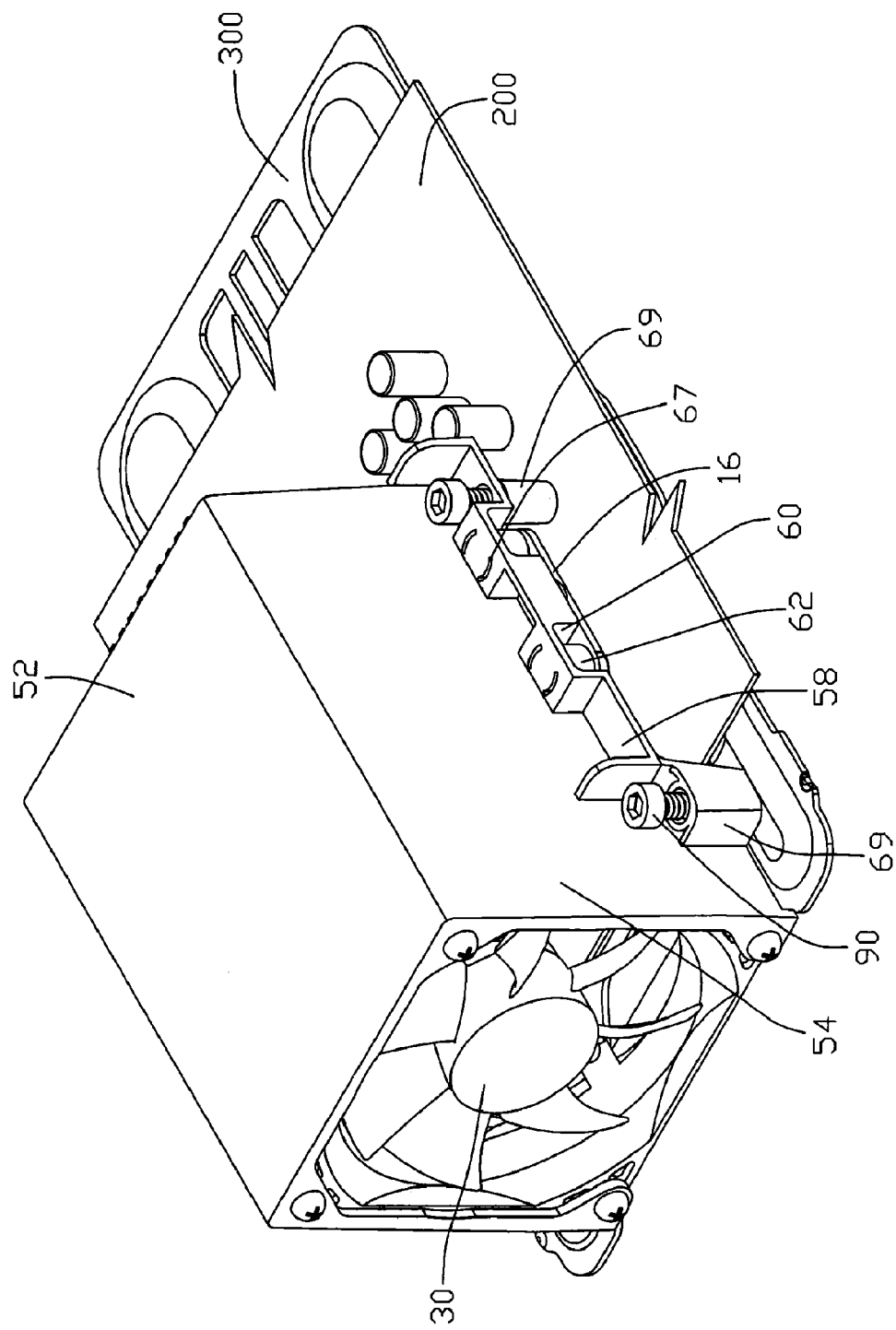
FIG. 6 is an isometric view of the cooling device mounted on a motherboard.
Figure 7:
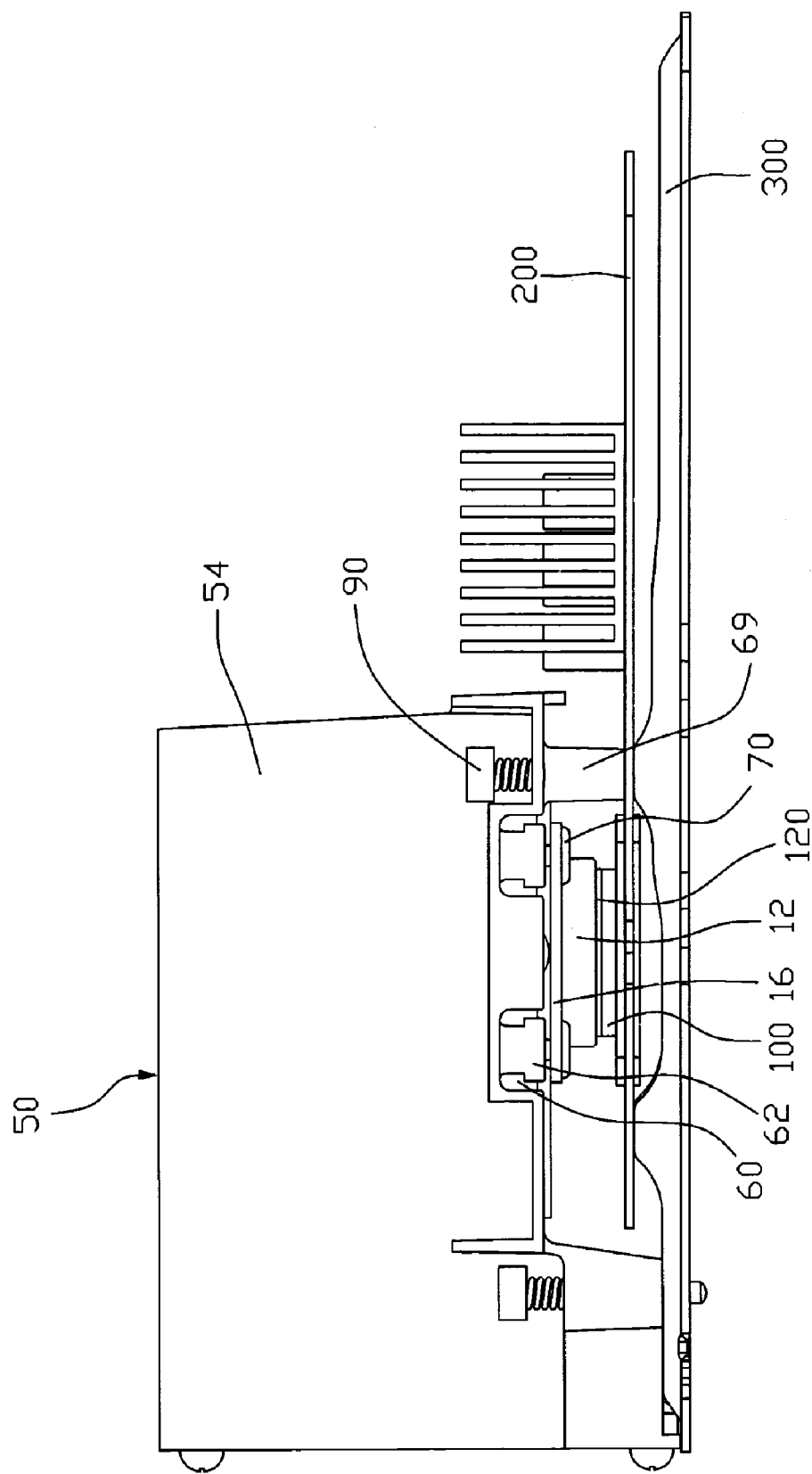
FIG. 7 is a side view of FIG. 6.

Referring to FIGS. 6-7, in assembly, the fan duct 50 covers on the heat sink 10 and fan 30 wherein the fan 30 is mounted in a front part of the fan duct 50 and the heat sink 10 is mounted in a rear part of the fan duct 50. Four screws (not labeled) extend through the bores 560 of the flange 56 of the fan duct 50 and screw into the corresponding apertures 34 of the frame 32 of the fan 30. The tubes 62 of the fan duct 50 are mounted just on the securing holes 160 of the mounting plate 16 of the heat sink 10 respectively. Each pole 66 of each tube 62 enters into a corresponding securing hole 160 of the heat sink 10 for locating the fan duct 50 on the heat sink 10 initially.

Then the pins 70 are pushed upwardly from a bottom surface of the mounting plate 16 of the heat sink 10 into the securing holes 160. Each pin 70 extends through a corresponding securing hole 160 of the heat sink 10 into the tube 62. The retaining rings 74 abut the bottom surface of the mounting plate 16. The hooks 76 of pins 70 are locked in the mounting holes 64, respectively. Thus, the fan duct 50 is secured to the mounting plate 16. Then four bolts 90 extend through the posts 69 of the mounting portion 58 of the fan duct 50 and screw into the corresponding holes (not labeled) of the motherboard 200 and the enclosure 300. Thus the cooling device is assembled on the motherboard 200 located on the enclosure 300 of the computer only by several bolts 90. The cost for production or assembly is decreased; the process of assembly is also simplified.

For the protrusions 68 formed between the grooves 60 of each of the mounting portions 58, they are used to abut downwards against the mounting plate 16 of the heat sink 10 thereby enabling the fan duct 50 to have a tight engagement with the mounting plate 16. During operation of the fan 30, the airflow generated by the fan 30 are guided by the fan duct 50 to substantially wholly flow through the fins 18 of the heat sink 10 thereby effectively taking heat away from the fins 18 of the heat sink 10. By the present invention, the airflow generated by the fan 30 is best utilized. The heat dissipation efficiency of the cooling device is improved.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A cooling device comprising:
   a heat sink comprising a chamber receiving working liquid therein and a mounting plate located at a bottom end of the chamber, two opposite edges of the mounting plate extending beyond two opposite sides of the chamber, each edge defining at least a securing hole therein, the working liquid evaporating when absorbs heat;
   a fan located at one side of the heat sink for generating a forced airflow through the heat sink;
   a fan duct covering the heat sink and fan therein, the fan duct comprising a top plate and two side plates extending downwardly from two opposite sides of the top plate, a mounting portion extending outwardly from each side wall and defining at least a tube corresponding to the at least a securing hole of the heat sink, and
   at least a pin extending through the at least a securing hole and locked in the at least a tube.

2. The cooling device as claimed in claim 1, wherein the mounting portion defines a groove above corresponding at least a securing hole, and the at least a tube extends downwardly in the groove and defines a mounting hole in an outer wall thereof, the at least a pin having a hook engaging in the mounting hole.

3. The cooling device as claimed in claim 2, wherein the fan duct is integrally formed, and an arc-shaped slits is defined in the mounting portion above a corresponding groove.

4. The cooling device as claimed in claim 1, wherein a protrusion having an arc shaped bottom surface extends downwardly from a bottom surface of the mounting portion and abuts the mounting plate of the heat sink.

5. The cooling device as claimed in claim 1, wherein the fan defines a plurality of apertures, and a flange extends inwardly from a front edge of the fan duct near the fan, a plurality of bores is defined in the flange corresponding to the apertures of the fan.

6. The cooling device as claimed in claim 1, wherein the chamber is integrally formed with the mounting plate.

7. The cooling device as claimed in claim 1, wherein a heat spreader is arranged at a bottom surface of the chamber, an opening is defined in the mounting plate corresponding to the heat spreader, the heat spreader being made of a material having a heat conductivity higher than that of the heat sink.

8. The cooling device as claimed in claim 1, wherein the chamber comprises a bottom wall, a cover hermetically connected with the bottom wall, a plurality of fins on the cover and a buffering region beside the fins, a part of the working fluid being received in the buffering region.

9. The cooling device as claimed in claim 8, wherein the bottom wall is integrally formed with the cover.

10. The cooling device as claimed in claim 8 further comprising a plurality of heat transfer enhancing structures extending from the bottom wall of the boiling chamber to the cover.

11. The cooling device as claimed in claim 10, wherein the heat transfer enhancing structures are integrally formed with bottom wall.

12. The cooling device as claimed in claim 8, wherein the cover comprises a top wall parallel to the bottom wall and a tower formed at a side of the top and bottom walls, the tower defining the buffering region.

13. The cooling device as claimed in claim 12, the tower has an inverted U-shaped cross section and comprises a pair of spaced side walls, one of which integrally extends from the top wall and the other of which is hermetically attached to the bottom wall, the buffering region is formed between the side walls.

14. The cooling device as claimed in claim 13, wherein the top wall is integrally formed with the tower.

15. The cooling device as claimed in claim 12, wherein the fins extend upwardly from the top wall.

16. The cooling device as claimed in claim 15, wherein the forced airflow generated by the fan flows through the fins.

17. A cooling device comprising:
   a heat sink having a boiling chamber defining a space receiving working liquid therein, the boiling chamber having a top wall from which a plurality of fins extending upwardly, a bottom wall adapted for receiving heat from a heat-generating device, the working liquid evaporating when absorbs the heat from the bottom wall;
   a mounting plate secured to a bottom surface of the bottom wall of the boiling chamber;
   a fan duct having a top wall and two side walls extending downwardly from the top wall and secured to the mounting plate; and
   a fan secured to the fan duct and generating a forced airflow which is guided by the fan duct to flow through the fins of the heat sink;
   wherein the boiling chamber has at least a tower formed at a side of the top wall, the tower defining a buffering region in which a portion of the working liquid is received, the space communicating with the buffering region, the working liquid having a level higher than that of a bottom surface of the top wall; and
   wherein a plurality of heat transfer enhancing structures extend from a top surface of the bottom wall to directly contact with a bottom surface of the top wall.

18. The cooling device as claimed in claim 17, wherein the bottom wall is attached with a heat spreader for thermally contacting with the heat-generating device, the heat spreader being made of a material having a heat conductivity higher than that of the heat sink, the heat spreader being surrounded by the mounting plate.

19. The cooling device as claimed in claim 17, wherein two opposite edges of the mounting plate extend beyond two opposite sides of the boiling chamber, each edge defines at least a securing hole therein, a mounting portion extends outwardly from each side wall of the fan duct and defines at least a mounting hole corresponding to the at least a securing hole of the mounting plate, and at least a pin extends through the at least a securing hole and locks in the at least a mounting hole.

* * * * *